(12) United States Patent
Van Der Wilk et al.

(10) Patent No.: US 12,189,309 B2
(45) Date of Patent: Jan. 7, 2025

(54) CLAMP ASSEMBLY

(71) Applicant: ASML Netherlands B.V., Veldhoven (NL)

(72) Inventors: Ronald Van Der Wilk, Knegsel (NL); Tiannan Guan, Best (NL)

(73) Assignee: ASML Netherlands B.V., Veldhoven (NL)

( * ) Notice: Subject to any disclaimer, the term of this patent is extended or adjusted under 35 U.S.C. 154(b) by 416 days.

(21) Appl. No.: 17/781,411

(22) PCT Filed: Nov. 2, 2020

(86) PCT No.: PCT/EP2020/080652
§ 371 (c)(1),
(2) Date: Jun. 1, 2022

(87) PCT Pub. No.: WO2021/110336
PCT Pub. Date: Jun. 10, 2021

(65) Prior Publication Data
US 2023/0008915 A1  Jan. 12, 2023

(30) Foreign Application Priority Data
Dec. 3, 2019 (EP) ..................................... 19213292

(51) Int. Cl.
*G03F 7/00* (2006.01)

(52) U.S. Cl.
CPC ...... *G03F 7/70708* (2013.01); *G03F 7/70858* (2013.01)

(58) Field of Classification Search
CPC .. G03F 7/70708; G03F 7/70858; G03F 7/707; G03F 7/70941; H01L 21/6831
(Continued)

(56) References Cited

U.S. PATENT DOCUMENTS 4,704,348 A * 11/1987 Koizumi ............. G03F 7/70866
430/311
2006/0285096 A1* 12/2006 Jacobs ................ G03F 7/70716
355/53
(Continued)

FOREIGN PATENT DOCUMENTS

EP  1521121 A2  4/2005
EP  1649325 A2  4/2006
(Continued)

OTHER PUBLICATIONS

JP-2000-200825; Matsushi electric Inc.; Entire specification (Year: 2000).*
(Continued)

*Primary Examiner* — Dharti H Patel
(74) *Attorney, Agent, or Firm* — DiBerardino McGovern IP Group LLC

(57) ABSTRACT

A clamp assembly is disclose, the clamp assembly comprising a clamp (50) configurable to clamp a support member (110) to a lower base surface (49) of the clamp by electrostatic adhesion, and an arrangement configurable to direct a gas to the lower base surface (49) of the clamp. The arrangement is configurable to humidify the gas by exposing the gas to a liquid. Also disclosed is a method of discharging a lower base surface of a clamp, The method comprises the steps of humidifying a gas by exposing the gas to a liquid, and directing the humidified gas to a lower base surface of the clamp.

15 Claims, 8 Drawing Sheets

(58) Field of Classification Search
USPC .......................................................... 361/234
See application file for complete search history.

(56) References Cited

U.S. PATENT DOCUMENTS

2014/0101964 A1    4/2014  Sirard et al.
2016/0276197 A1*   9/2016  Kim ..................... C23C 16/458

FOREIGN PATENT DOCUMENTS

JP    2000200825 A    7/2000
WO    2005008339 A2   1/2005

OTHER PUBLICATIONS

EP-1521121; Canon KK; Entire specification (Year: 2005).*
Wiebo van Toledo, European International Searching Authority, International Search Report and Written Opinion, counterpart PCT Application No. PCT/EP2020/080652, mailed Feb. 2, 2021, 34 pages total.
Research Disclosure, Kenneth Mason Publications, Hampshire, UK, GB, vol. 627, No. 44, Jul. 1, 2016.

* cited by examiner

CLAMP ASSEMBLY

CROSS-REFERENCE TO RELATED APPLICATIONS

This application claims priority of EP application 19213292.6 which was filed on Dec. 3, 2019 and which is incorporated herein in its entirety by reference.

FIELD

The present invention relates to a clamp assembly and an associated method of use of the clamp assembly. The clamp assembly may find utility in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

At such short wavelengths, precise positioning of the patterning device and/or substrate within the lithographic apparatus is essential.

Such lithographic apparatuses may be provided with one or more clamps to clamp the patterning device and/or substrate to an object support, such as a mask table or a wafer table respectively. The clamp may be, for example, a mechanical clamp, a vacuum clamp, or an electrostatic clamp. Electrostatic clamps may be particularly suited to operating at EUV wavelengths, since regions of an EUV lithographic apparatus necessarily operate under near vacuum conditions.

Electrostatic clamps are often maintained in a low-pressure hydrogen-rich environment, which is a generally non-conductive environment. As such, electric charge may accumulate on dielectric or ungrounded surfaces of the clamp. The accumulated charge may be non-uniformly distributed across the surfaces. Such non-uniformly distributed accumulated charge may have detrimental effects on the general operation of the lithographic apparatus. For example, a non-uniformly distributed charge on a charged surface of a clamp may result in unwanted deformation of components of the lithographic apparatus in relatively close proximity to the clamp, potentially affecting precise positioning of the patterning device and/or substrate within the lithographic apparatus.

It is an object of at least one embodiment of at least one aspect of the present invention to obviate or at least mitigate at least one of the above identified shortcomings of the prior art.

SUMMARY

According to an aspect of the present invention, there is provided a clamp assembly, the clamp assembly comprising a clamp configurable to clamp a support member to a lower base surface of the clamp by electrostatic adhesion, and an arrangement configurable to direct a gas to the lower base surface of the clamp, wherein the arrangement is configurable to humidify the gas by exposing the gas to a liquid.

Advantageously, a humidified gas may more effectively discharge the lower base surface of the clamp than a non-humidified gas.

The clamp may be configurable to clamp an article to an upper base surface of the clamp by electrostatic adhesion. Advantageously, this electrostatic clamping may enable clamping a substrate in vacuum.

The arrangement may be configurable to condense at least a part of the liquid on the lower base surface of the clamp and to remove the at least a part of the liquid from the lower base surface of the clamp. The arrangement may be configurable to maintain a pressure of the gas at or above a first threshold, wherein the first threshold corresponds to a pressure that equals 80% of a vapor pressure of the liquid at a temperature of the lower base surface of the clamp. Alternatively the first threshold may correspond to a pressure that equals 90% or 100% of a vapor pressure of the liquid at a temperature of the lower base surface of the clamp. The percentage may depend on the lower base surface condition to condense at least part of the liquid on the lower base surface of the clamp.

Advantageously, maintaining a pressure of the gas at or above this threshold may result in condensation of the liquid forming on the lower base surface of the clamp, which may accelerate discharging of the lower base surface.

The arrangement may be configurable to maintain a pressure of the gas at or below a second threshold, wherein the second threshold corresponds to a pressure sufficient to move or lift the clamp with respect to the assembly.

The arrangement may be configurable to remove the humidified gas from the lower base surface of the clamp.

Advantageously, this may remove a residual charge from the lower base surface of the clamp.

The lower base surface of the clamp may be provided with an opening configured to direct the humidified gas out of the opening.

The arrangement may comprise a pump. The arrangement may comprise at least one pressure sensor. The arrangement may comprise a controller. The controller may be communicably coupled to the pump and the pressure sensor.

The arrangement may comprise a reservoir for the liquid. The arrangement may be configurable to expose the gas to the liquid by directing the gas through the reservoir.

The lower base surface of the clamp may comprise at least one burl. The at least one burl may define at least one channel between the clamp and a support member.

An upper surface of the support member may be provided with an opening configured to direct the humidified gas out of the opening.

The clamp assembly may comprise one or more fluid conduits. The arrangement may be configurable to direct the gas into the at least one channel via the one or more fluid conduits.

The clamp may be configurable to be coupled to the support member by electrostatic adhesion.

According to a further aspect of the present invention, there is provided a method of discharging a lower base surface of a clamp, wherein the clamp is configurable to clamp a support member to the lower base surface of the clamp by electrostatic adhesion, and wherein the method comprises the steps of: humidifying the gas by exposing the gas to a liquid; and directing the humidified gas to the lower base surface of the clamp.

The method may further comprises a step of pressurizing the gas to between a first and a second threshold, wherein the first threshold is 80% or 90% or 100% of a vapor pressure of the gas at a temperature of the lower base surface of the clamp, and the second threshold is a pressure sufficient to move or lift the clamp with respect to the support member or the assembly.

The method may further comprise a step, e.g. a subsequent step, of removing the humidified gas from the lower base surface of the clamp.

The step of exposing the gas to a liquid may comprise directing the gas through a reservoir of the liquid.

The liquid may comprises at least one of water and/or isopropanol alcohol.

The lower base surface of the clamp may be discharged after the article has been removed from the upper base surface of the clamp.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
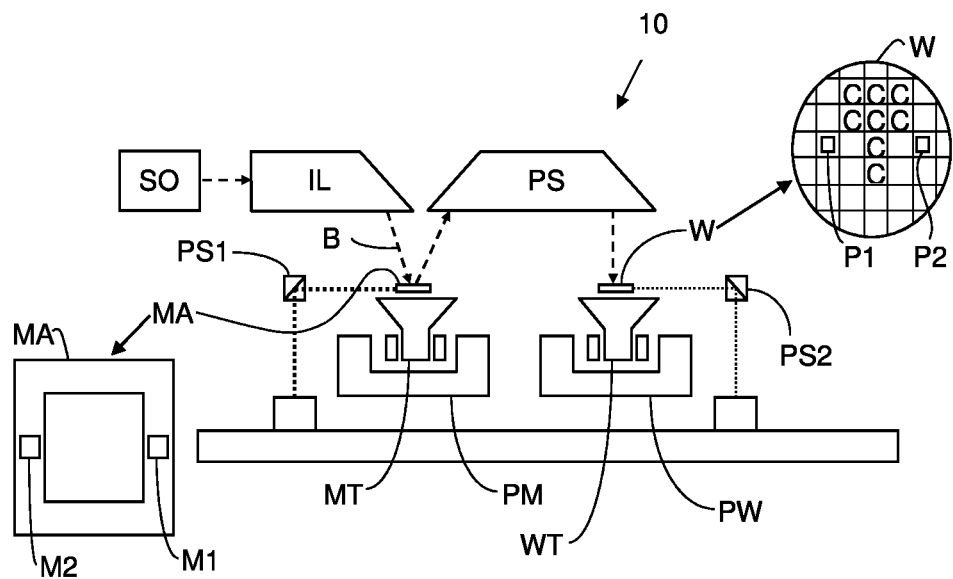
FIG. 1 depicts a schematic overview of a lithographic apparatus.

FIG. 1 schematically shows a lithographic apparatus 10 including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be reflective (as in lithographic apparatus 10 of FIG. 1) or transmissive. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin which has one or more emission lines in the EUV range. The electrical discharge may be generated by a power supply which may form part of the source collector apparatus or may be a separate entity that is connected via an electrical connection to the source collector apparatus.

The illuminator IL may comprise an adjuster for adjusting the angular intensity distribution of the radiation beam. Generally, at least the outer and/or inner radial extent (commonly referred to as .sigma.-outer and .sigma.-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
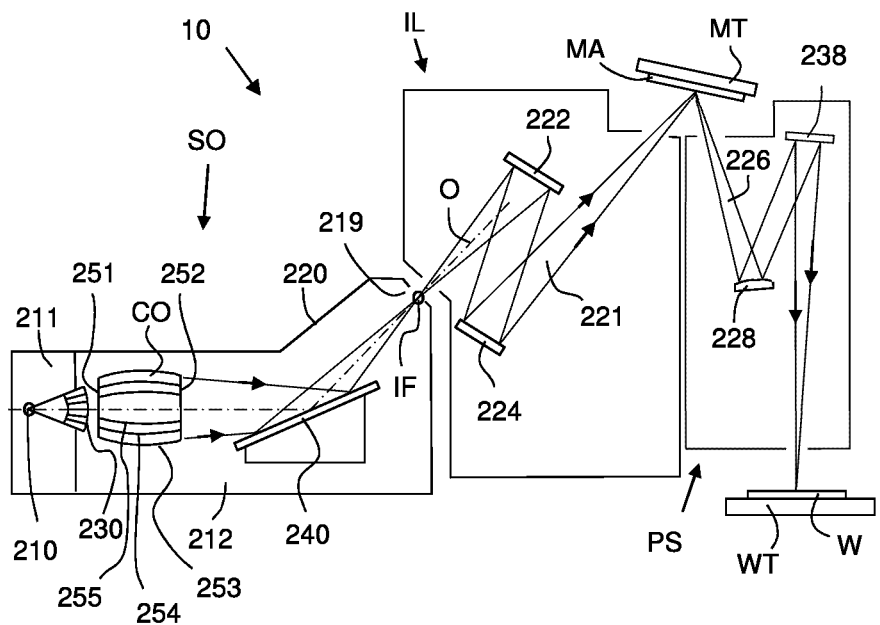
FIG. 2 depicts a schematic overview of a lithographic apparatus.

FIG. 2 shows the lithographic apparatus 10 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 238 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figs., for example there may be 1-6 additional reflective elements present in the projection system PS than shown in FIG. 2

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
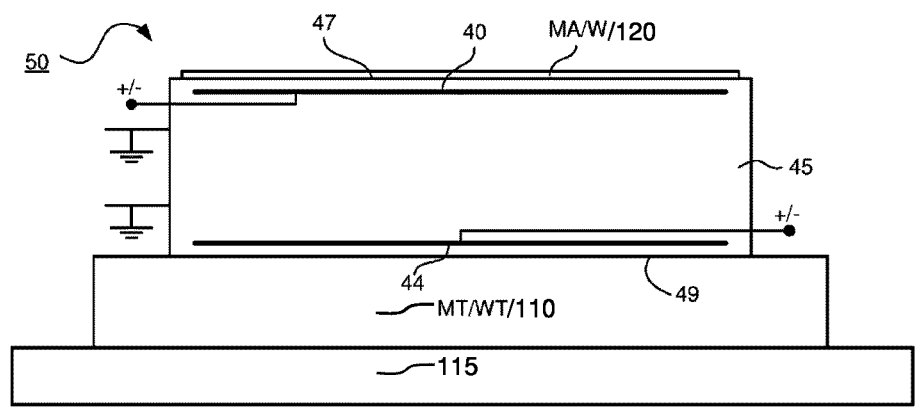
FIG. 3 depicts a cross sectional view of a clamp assembly according to an embodiment of the invention.

FIG. 3 depicts, in cross section, a clamp assembly 100 comprising an electrostatic clamp 50, also known as an e-clamp or an e-chuck, according to an embodiment of the invention. In the embodiment shown, the clamp 50 is mounted on a substrate table WT 110 or a mask table 110. In an embodiment the clamp 50 comprises a body 45. The body may comprise a dielectric material. The body 45 may have a thickness in the region of from about 0.5 cm to about 2 cm, and preferably about 1 cm. The thickness of the body 45 is measured from an upper base surface 47 of the body 45 to a lower base surface 49 of the body 45.

In the following description, the terms ground and zero voltage are used for convenience. It is not necessary for any part of the lithographic apparatus to be grounded or to have zero potential. The terms ground and zero voltage should be interpreted to mean a voltage approximately equal to the voltage of the substrate W that is held by the clamp 50.

In an embodiment the clamp 50 comprises an electrode 40 configured to impart a charge to a surface (e.g. the upper base surface 47) of the body 45. In an embodiment the clamp 50 further comprises a lower electrode 44 configured to impart a charge to a surface (e.g. the lower base surface 49) of the body 45. In an embodiment the clamp 50 comprises more than one of the electrode 40 and/or more than one of the lower electrode 44. The electrode 40 or/and the lower electrode 44 may, for example, comprise a plurality of conductors, such as an array of interdigitated and/or substantially parallel conductors.

The electrode 40 and the lower electrode 44 are each for applying a potential difference between the electrode 40, 44 and the surface (e.g. the upper base surface 47 or the lower base surface 49) of the body 45. The potential difference may be such as to cause a charge to accumulate on the upper base surface 47, for example. The accumulated charge can electrostatically attract and hold a substrate W in contact with the clamp 50. In a similar way the potential difference may be such as to cause a charge to accumulate on the lower base surface 49, for example. The accumulated charge can electrostatically attract and hold a substrate table WT 110 or a mask table MT 110 in contact with the clamp 50. In particular the substrate W may be in close contact with the clamp 50, providing contact area and no-contact areas depending on the roughness of the materials used. The clamping force is located in the small no-contact areas that are formed due to the roughness of the materials. This effect is known as the Johnsen-Rahbek effect. A clamp that operates based on this effect may be referred to as a Johnsen-Rahbek clamp, a J-R clamp, or a JR clamp. In an embodiment the clamp 50 of the present invention is arranged to clamp the substrate W electrostatically at least partly by Johnsen-Rahbek clamping. The J-R attraction force increases approximately linearly with the voltage applied to the electrode 40.

In an embodiment, the body 45 may have a resistivity that is so high that no significant current can pass between the electrode 40 and the upper base surface 47. In this case, the Johnsen-Rahbek effect may not occur to any significant extent. However, an attractive force between the electrode 40 and the substrate W may still occur due to the potential difference between these elements. The electrode 40 and the substrate W may act as two plates of a capacitor and be attracted to each other in the same way as the two plates of a charge capacitor. Clamps/chucks that operate predominantly on this principle may be referred to as Coulombic clamps. J-R clamps will also involve some degree of attraction by the Coulombic mechanism, but the J-R effect will normally be dominant in such clamps. In an embodiment the clamp 50 of the present invention is arranged to clamp the substrate W electrostatically by Coulombic clamping. The electrode 40 and the lower electrode 44 may be a unipolar or bipolar respectively.

Figure 4:
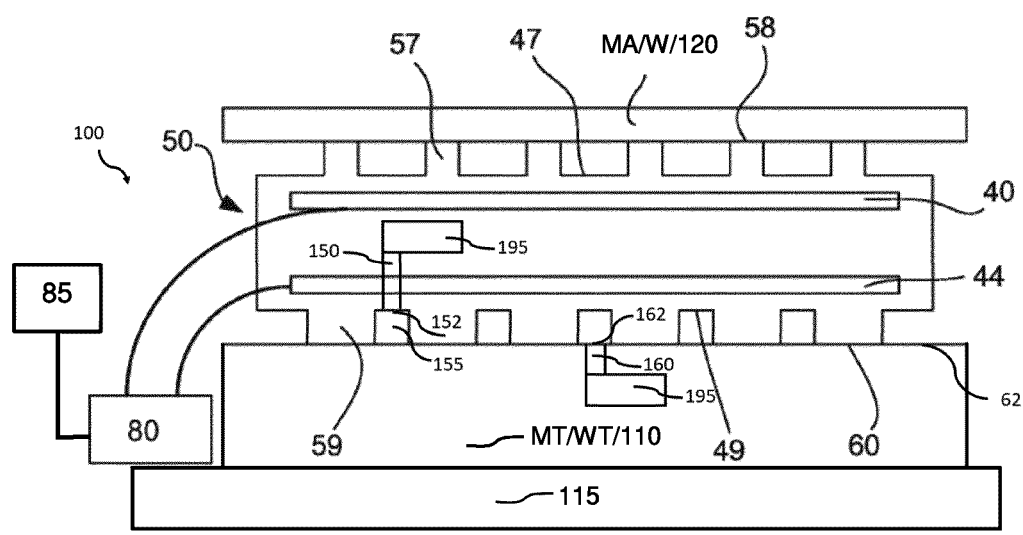
FIG. 4 depicts a cross sectional view of a clamp assembly according to an embodiment of the invention.

FIG. 4 depicts, in cross section, a clamp assembly, generally denoted 100, according to an embodiment of the present invention. In an embodiment the clamp assembly 100 comprises a clamp 50, also known as a chuck. The clamp 50 is an electrostatic clamp. The clamp 50 comprises a plurality of upper burls 57 protruding above the upper base surface 47 of the clamp 50. Each of the plurality of upper burls 57 has a respective distal end 58. The plurality of upper burls 57 are arranged such that, when the substrate W is supported by the clamp 50, the substrate W is supported by the respective distal end 58 of each of the plurality of the upper burls 57.

An advantage of the upper burls 57 is that they reduce the impact of contaminant particles on substrate flatness. This is because a particle can only cause a deformation of the flatness when on N upper burls 57, unless the particle is larger than the gap between the clamp 50 and the substrate W. In such an embodiment the contact area between the substrate W and the clamp 50 is a percentage of the total area of the upper surface of the clamp 50. For example the percentage may be in the region of from about 0.5% to about 10%, and preferably about 1.5%. In an embodiment the upper burls 57 may each have a height within the region of from about 2 μm to about 200 m and preferably about 10 μm. The height is how far the upper burl 57 protrudes from the upper base surface 47 between the upper burls 57.

Another advantage of the upper burls 57 is that they allow backfill gas to sit between the substrate W and the clamp 50, thereby providing better thermal conductivity between the substrate W and the clamp 50. In such an embodiment, the region between the substrate table WT and the substrate W may be maintained at partial vacuum. Such an arrangement will tend to facilitate removal of the substrate W, for example because Van Der Waals forces acting between a substrate table WT and the substrate W are less strong.

In an embodiment the clamp 50 comprises a plurality of lower burls 59 protruding below the lower base surface 49 of the clamp 50. Each of the plurality of lower burls 59 has a respective distal end 60. The plurality of lower burls 59 are arranged such that, when the clamp 50 is supported on the substrate table WT 110 or on the mask table MT 110, the clamp 50 is supported by the respective distal end 60 of each of the plurality of the lower burls 59. In an embodiment the dimensions of the lower burls 59 is the same as the dimensions of the upper burls 57.

In an embodiment the lithographic apparatus comprises a controller 85. In an embodiment the lithographic apparatus comprises a power supply 80. In an embodiment the controller 85 is configured to control the power supply 80 to apply to the electrode 40 a voltage having a clamping polarity so as to provide a clamping force between the clamp 50 and the substrate W on the clamp 50.

The clamp assembly 100 comprises a support member 110. This support member 110 may be the mask table 110 or the substrate table 110. The support member 110 is moveably coupled to a further support member 115, which may be a table, a stage, or the like.

For purposes of example, the clamp assembly 100 is shown coupled to, e.g. clamped to, an article 120. The article 120 may be a substrate, more specifically a wafer. It will be appreciated that in other embodiments falling within the scope of the present invention the clamp assembly 100 may be suitable for coupling to a patterning device MA.

The upper or/and lower burls 140 may comprise a dielectric material, for example the same material as the body 45. The upper or/and lower burls 57, 59 may comprise, for example, cuboids, cylinders, pyramids, conical frustums, or the like respectively.

It will be appreciated that many features of the clamp assembly 100, and in particular of the clamp 50 have been omitted from FIG. 4 for purposes of simplicity. For example, features such as electrical wiring and any additional electrodes have been omitted.

In some embodiments, the clamp 50 may comprise one or more internal channels, e.g. internal fluid channels. Such internal channels may be provided for a thermally conditioned fluid to enhance thermal transfer from the clamp 50. The internal fluid channels are also not shown, for purposes of simplicity. A fluid distribution system may be configured to condition the fluid, e.g. water or another fluid, to a desired temperature before distributing the fluid to circulate through electrostatic clamp 50. The thermally conditioned fluid may be circulated to help to regulate a temperature of clamp 50 and/or the article 120.

The support member 110 may be configurable to be moved relative to the further support member 115, in order to precisely position the article 120 relative to, for example, a focal point of a radiation beam B.

The electrostatic clamp shown in FIG. 4 comprises a first fluid conduit 150 for introducing a gas, known as a backfill gas, into voids or channels 155 formed between the lower burls 59, the lower base surface 49 of the clamp 50, and an upper surface 62 of the support member 110. The gas may comprise hydrogen. The gas may comprise a relatively inert gas, such as argon or the like. The gas may comprise $CO_2$. The gas may be a thermally conditioned gas, e.g. a temperature regulated gas. Such a gas may enhance thermal transfer from the clamp 50 or/and the support member 110. A clamping pressure, e.g. a pressure acting upon the support member 110 to hold the clamp 50 against the support member 110 due to electrostatic forces, is larger than a pressure of the gas, in order to fix the clamp 50 to the support member 110. In some instances, temporary increases in the gas pressure may beneficially assist releasing of the clamp 50 from the support member 110. For purposes of example only, the first fluid conduit 150 is shown forming a fluid conduit path provided with an opening 152 at the lower base surface 49 of the clamp 50. It will be appreciated that in other embodiments, other fluid conduit paths may be implemented. In an embodiment, the first fluid conduit 150 is provided with a plurality of openings 152 at the lower base surface 49 of the clamp 50. In the example embodiment depicted in FIG. 4, the openings 152 are located at a peripheral part of the lower base surface 49 of the clamp 50. The openings 152 may be distributed on the lower base surface 49 of the clamp 50 to ensure a gas, e.g., a humidified gas, flowing though the openings 152, comes into direct contact with all, or substantially all, of the lower base surface 49 of the clamp 50. In a further example embodiment, one or more openings 152 may be additionally and/or alternatively located at, or substantially at, a central part of the lower base surface 49 of the clamp 50. The one or more openings 152 may be oriented and/or configured to radially direct a flow gas from the central part, such that substantially all of the lower base surface 49 of the clamp 50 comes into direct contact with the gas.

The example clamp assembly 100 comprises a gas distribution system 195. The gas distribution system 195 is configured to supply the backfill gas to the voids or channels 155 formed between the lower burls 59, the lower base surface 49 of the clamp 50 and the upper surface 62 of the support member 110 via the first fluid conduit 150. Features of the gas distribution system 195 will be described in more detail with reference to FIG. 5.

A plurality of lower burls or feet 59 are located on a lower base surface 49 of the clamp 50. A lower surface 60 of the burls or feet 59 defines a plane at which the clamp 50 is coupled to an upper surface 62 of the support member 110 in use. Although only six burls or feet 59 are shown in FIG. 4 for purposes of example only, it will be appreciated that more than six burls or feet, i.e. a multiplicity of burls or feet 59, may be provided on the lower base surface 49 of the clamp 50. The burls or feet 155 may be distributed across the lower base surface 49 of the clamp 50.

In use, an electrical charge may accumulate on at least a portion of the lower base surface 49 of the clamp 50. Upon removal of the voltage applied to the lower electrode 44, a residual charge may remain on the at least a portion of the lower base surface 49 of the clamp 50. The residual charge may exert a repellant or an attractive force between the clamp 50 and the support member 110. Furthermore, the residual charge may be non-uniformly distributed across the lower base surface 49 of the clamp 50. Such a non-uniformly distributed residual charge may result in a deformation of the support member 110 or/and the clamp 50. Such a deformation may affect a position and/or orientation detection of the clamp assembly 100.

In an embodiment of the invention, the clamp assembly 100 comprises an arrangement configurable to direct a gas to the lower base surface 49 of the clamp 50 via one or more fluid conduits 150. In the example embodiment of FIG. 4, the arrangement comprises a second fluid conduit 160 for introducing a humidified gas into voids or channels 155 formed between burls or feet 59, the lower base surface 49 of the clamp 50 and the upper surface 62 of the support member 110. The humidified gas may be a thermally conditioned gas, e.g. a temperature regulated gas. The second fluid conduit 160 is shown forming a fluid conduit path extending provided with an opening 162 at the upper surface 62 of the support member 110. The opening 162 may be located at a center part of the clamp 50. The second fluid conduit 160 may be connected to the gas distribution system 195 used for the first fluid conduit 150 or a separate gas distribution system.

The assembly 100 may also comprise one or more further conduits or vents (not shown) configurable to direct the humidified gas away from the voids or channels 155 formed between burls or feet 59. In an embodiment, the humidified gas may be pumped away from the opening 152 or/and the opening 162.

The gas distribution system 195 may be configured to humidify a gas to form the humidified gas. For example, gas distribution system 195 may be configured to humidify backfill gas to form a humidified backfill gas.

Figure 5:
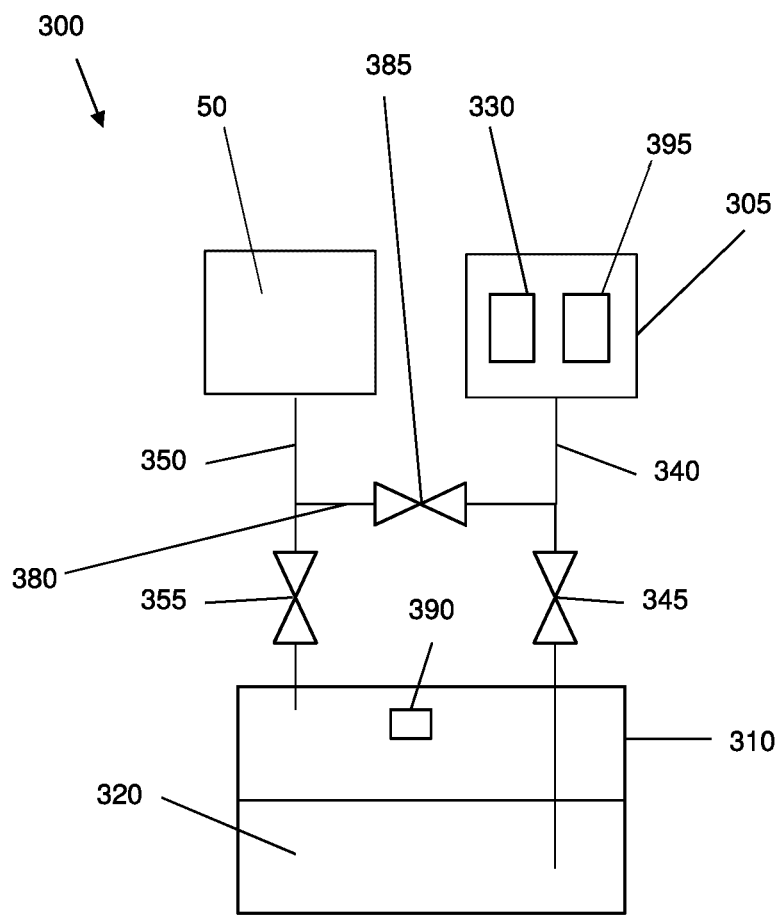
FIG. 5 depicts features of a gas distribution system according to an embodiment of the invention.

FIG. 5 depicts features of an example embodiment of the gas distribution system 195. In particular, FIG. 5 depicts an example arrangement 300 configurable to humidify a gas by exposing the gas to a liquid 320. The arrangement 300 comprises a reservoir 310. The reservoir 310 is configurable to contain the liquid 320. Preferably, the liquid 320 comprises water, e.g. distilled water. The liquid 320 may comprise isopropanol alcohol. Alternatively the liquid 320 may comprise or be any fluid with a conductivity of at least 1 µS/m at 25° C.

The arrangement 300 comprises a gas supply system 305. The gas supply system 305 comprises a pump 330. The pump is configured to pump a gas, e.g. the backfill gas, into the reservoir 310 via a fluid conduit 340. Preferably, the fluid conduit 340 is configured to expose the gas to the liquid 320 in the reservoir 310. In the example embodiment of FIG. 5, the fluid conduit 340 extends below a surface of the liquid 320 in the reservoir 310. As such, gas pumped into the reservoir 310 by the pump 330 via the fluid conduit 340 is exposed to the liquid 320, and thus humidified to form a humidified gas.

A further fluid conduit 350 is configured to direct the humidified gas from the reservoir 310 to a clamp 50. The clamp 50 may be, for example, a clamp 50 as described above with reference to FIG. 4.

The fluid conduit 340 comprises a first valve 345 configurable between an open and a closed configuration. In the closed configuration, the first valve 345 inhibits flow of the gas from the gas supply system 305 into the reservoir 320. In the open configuration, the first valve 345 allows flow of the gas from the gas supply system 305 into the reservoir 320.

The further fluid conduit 350 comprises a second valve 355 configurable between an open and a closed configuration. In the closed configuration, the second valve 355 inhibits flow of the gas from the reservoir 320 towards the clamp 50. In the open configuration, the second valve 355 inhibits flow of the gas from the reservoir 320 towards the clamp 50.

The arrangement 300 comprises a bypass fluid conduit 380. The bypass fluid conduit 380 communicably couples the fluid conduit 340 and the further fluid conduit 350. The bypass fluid conduit 380 comprises a third valve 385 configurable between an open and a closed configuration. In the closed configuration, the third valve 385 inhibits a flow of the gas directly between the fluid conduit 340 and the further fluid conduit 350. In the open configuration, the third valve 385 allows a flow of the gas directly between the fluid conduit 340 and the further fluid conduit 350.

As such, by configuring the first and second valves in the open configuration and the third valve in the closed configuration, a gas pumped by pump 330 from the gas supply system 305 into the first fluid conduit 340 is humidified by the liquid 320 in the reservoir 310 before being directed towards the clamp 50 by the further fluid conduit 350. That is, the arrangement 300 is configurable to expose the gas to the liquid 320 by directing the gas through the reservoir 310. Alternatively, by configuring the first and second valves in the closed configuration and the third valve in the open configuration, a gas pumped by pump 330 from the gas supply system 305 into the first fluid conduit 340 bypasses the reservoir 310 and is instead directed towards the clamp 50 by the bypass conduit and the further fluid conduit 350. As such, the arrangement 300 is also configurable to direct a non-humidified gas towards the clamp 50.

In an example embodiment, the reservoir comprises a pressure sensor 390. The pressure sensor 390 is configured to sense a pressure of the humidified gas in the reservoir 310.

It will be appreciated that in other embodiments the pressures sensor 390 may be disposed at alternative locations within the arrangement 300 or within the clamp assembly 100. For example, the pressure sensor 390 may be disposed in the gas supply system 305, in one of the fluid conduits 340, 350, 360, or within the clamp 50. Furthermore, one or more additional pressure sensors may be implemented within the arrangement 300. In an embodiment, the reservoir may comprise a flow sensor (not drawn in FIG. 5). The flow sensor is configured to sense a flow of the humidified gas in the reservoir 310. It will be appreciated that in other embodiments the flow sensor may be disposed at alternative locations within the arrangement 300 or within the clamp assembly 100. For example, the flow sensor may be disposed in the gas supply system 305, in one of the fluid conduits 340, 350, 360, or within the clamp 50. Furthermore, one or more additional pressure sensors may be implemented within the arrangement 300.

The gas supply system 305 comprises a controller 395. The controller 395 is communicably coupled to the pressure sensor 390 (or/and to the flow sensor). The controller 395 is also communicably coupled to the pump 330. As such, the controller maybe configurable to control a pressure (or/and a flow) of humidified gas in the reservoir 310. That is, the controller may be configured to control, e.g. operate, the pump 330 in response to a sensed pressure by the pressure sensors 390 or/and by a sensed flow by the flow sensor.

Furthermore, in some embodiments, the first valve 345 and/or second valve 355 and/or third valve 385 is/are communicably coupled to the controller 395. As such, the controller 395 may be configurable to configure each of the first valve 345 and/or second valve 355 and/or third valve 385 between the open and closed configurations.

In use, the pump 330 may be configured to increase or decrease a pressure of the humidified gas.

The humidified gas, when directed towards the lower base surface 49 of the clamp 50, may discharge a residual charge present of the clamp 50. In particular, after an article 120 has been removed from the clamp assembly 100, any residual charge present on the lower base surface 49 of the clamp 50 may be removed, e.g. discharged, by the humidified gas.

Discharging of the lower base surface 49 of the clamp 50 may be accelerated by increasing the pressure of the gas to above a first threshold, wherein the first threshold corresponds to a pressure that equals 80% of a vapor pressure of the liquid at a temperature of the lower base surface 49 of the clamp 50. Alternatively, the first threshold corresponds to a pressure that equals 90% or 100% of a vapor pressure of the liquid at a temperature of the lower base surface 49 of the clamp 50. That is, an arrangement such as gas distribution system 195 of FIG. 4, is configurable to maintain a pressure of the gas at or above the first threshold. The percentage may depend on the lower base surface condition to condense at least part of the liquid on the lower base surface 49 of the clamp 50.

In an embodiment, discharging of the lower base surface 49 of the clamp 50 may be at a pressure of the gas below a first threshold, namely below the vapor pressure of the liquid. That is, using partly humidified gas.

In an example embodiment wherein the liquid is water, increasing the pressure of the humidified gas to above the vapor pressure of water at a temperature of the lower base surface 49 of the clamp 50 will cause water to condense on the lower base surface 49 of the clamp 50. Condensation on the lower base surface 49 of the clamp 50 may accelerate discharging of the lower base surface 49 of the clamp 50, as described below with reference to FIGS. 6a and 6b.

When increasing the pressure of the gas to above a first threshold, a second threshold which corresponds to a pressure sufficient to move or lift the clamp 50 with respect to the support member 110, should not be exceeded, to prevent lifting of the clamp 50 with respect to the support member 110. That is, an arrangement such as gas distribution system 195 of FIG. 5, is configurable to maintain a pressure of the gas at or below a second threshold, wherein the second threshold corresponds to a pressure sufficient to move or lift the clamp with respect to the support member 110.

Figure 6A:
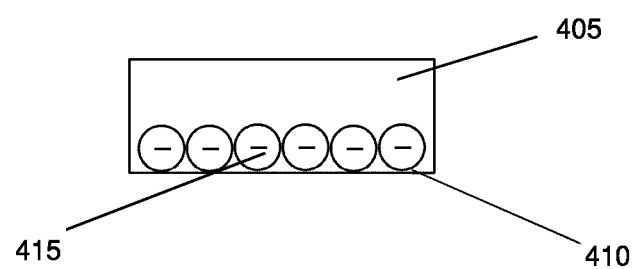
FIGS. 6*a-b* are a sequence of diagrams depicting discharging of a surface of a clamp.

FIG. 6a shows an example of a clamp 405. A surface 410, e.g. a lower base surface, of the clamp 405 is negatively charged, as represented by a plurality of electrons 415 accumulated at the surface 410. The negative charge may be a residual charge, e.g. a charge present after an article has been removed from the clamp 405.

Figure 6B:
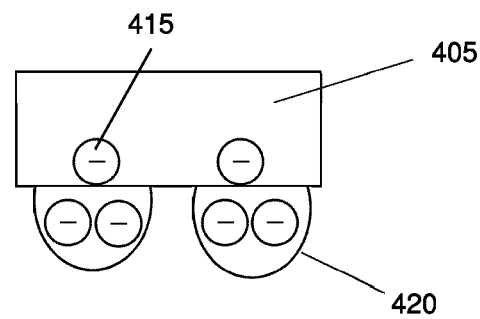

FIG. 6b shows the portion of a clamp 405, wherein a liquid has condensed on the surface 410. The liquid is represented as condensed droplets 420 but may also be a condensed film. The liquid may be condensed on the surface 410 by increasing a pressure of a humidified gas in contact with the surface 410, e.g. a gas humidified with the liquid, until the pressure reaches, and/or exceeds a vapor pressure of the liquid at the temperature of the surface 410. The negative charge on the surface 410 may be at least in part, transferred to the condensed droplets 420.

Figure 7:
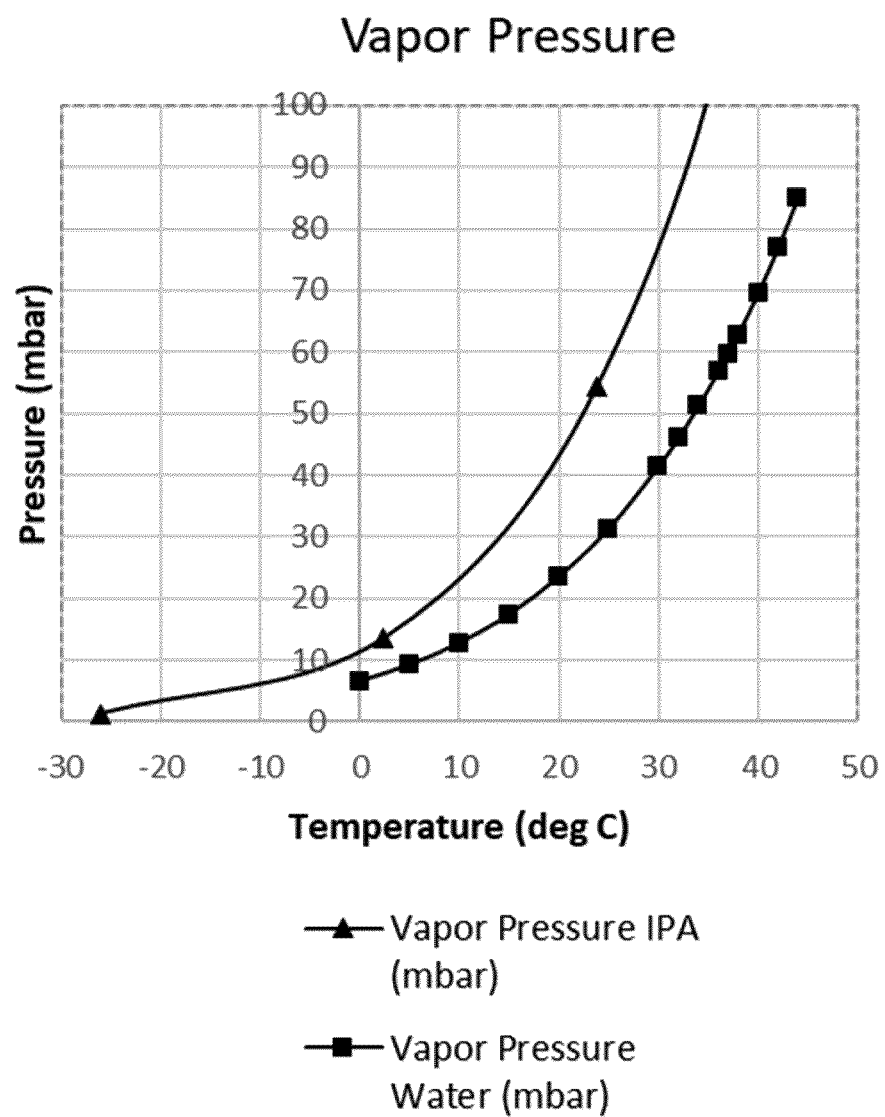
FIG. 7 is a graph showing a relationship between the vapor pressure of water and isopropanol alcohol (IPA) and temperature.

FIG. 7 shows a relationship between the vapor pressure of water and the vapor pressure of isopropanol alcohol (IPA) and temperature. It can be seen, for example, that at approximately 25 degrees Celsius a vapor pressure of water is approximately 31.3 mbar. That is, at a temperature of 25 degrees Celsius it is necessary to pressurize the gas humidified with water to approximately 31.3 mbar to trigger condensation at a surface of the clamp. The vapor pressure may depend on the surface condition.

It can be seen that a vapor pressure of IPA at 25 degrees Celsius is approximately 55 mbar.

In an embodiment, a liquid such as water may be selected to humidify the gas, e.g. the backfill gas, such that the gas can be pressurized to above 80%, or 90%, or 100% of the vapor pressure of the liquid without exceeding a pressure threshold at which the clamp 50 may be lifted with respect to the support member 110 or the assembly 100. In some example use case, a mixture of liquids may be employed. For example, a mixture of water and IPA may be used. A ratio of IPA to water may be selected such that the gas can be pressurized to above the vapor pressure of the liquid mixture without exceeding a pressure threshold at which the clamp 50 may be lifted with respect to the support member 110 or the assembly 100.

A pressure of the humidified gas may be maintained at or above a vapor pressure of the liquid used to humidify the gas for a predefined duration of time. For example, the pressure may be maintained at or above the vapor pressure of the liquid for 1, 5, 10, 60 minutes, or longer, to ensure sufficient discharge of the surface of the clamp.

In an embodiment, the discharging technique of the lower base surface 49 of the clamp 50 may also be applied to the upper base surface 47 of the clamp 50. For that, humidified gas should be directed to the upper base surface 47 of the clamp 50. This may be done through an opening on the upper base surface 47.

Figure 8:
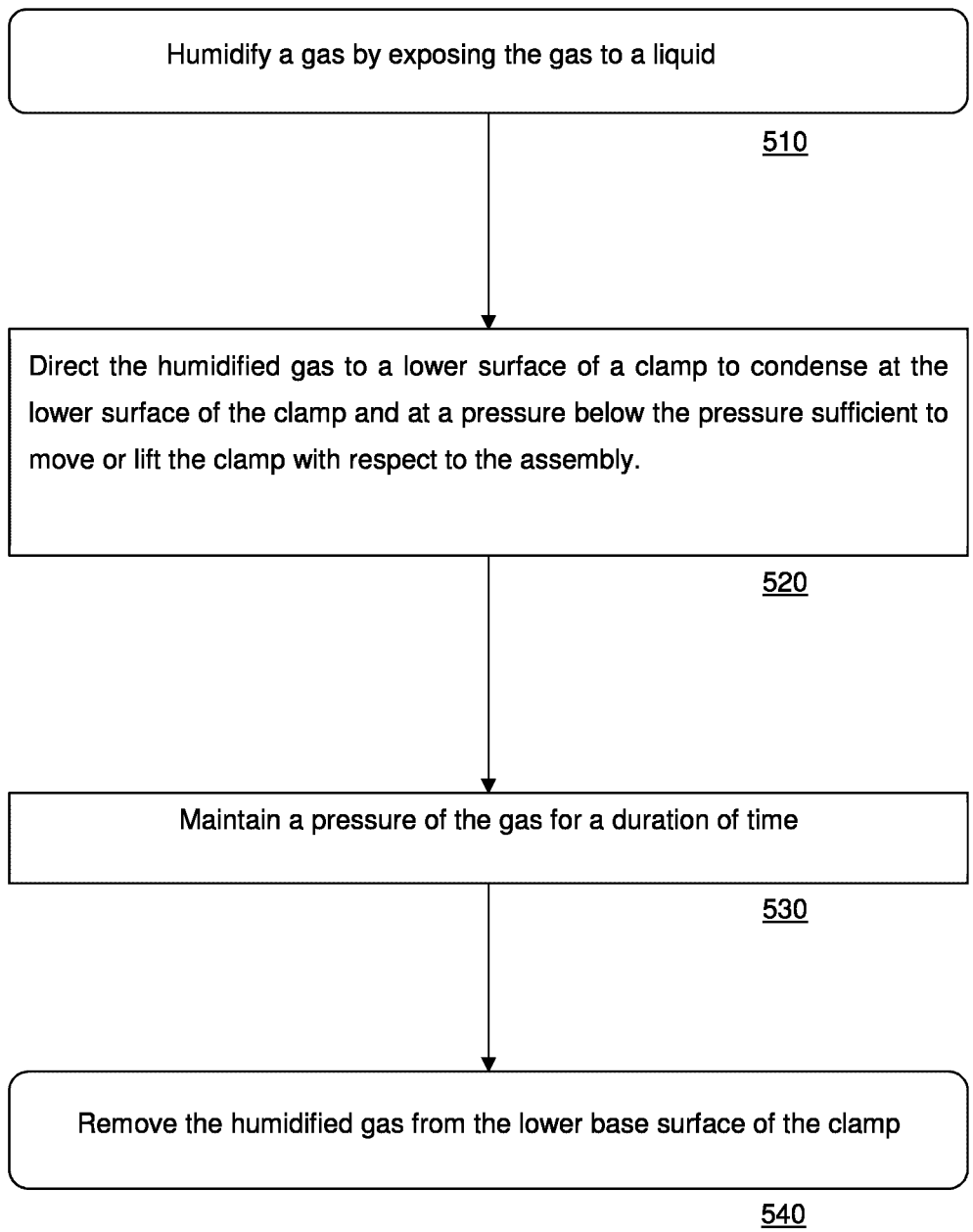
FIG. 8 is a flow diagram of discharging a lower base surface of a clamp according to an embodiment of the invention.

FIG. 8 shows a method of discharging a lower base surface of a clamp according to an embodiment of the invention. In a first step 510, a gas is humidified by exposing the gas to a liquid. The gas may be a backfill gas. The gas may comprise, for example, Hydrogen, or an inert gas such as Argon. The gas may be humidified by exposing the gas to a liquid using the features of the gas distribution system as described above with respect to FIG. 5.

In a second step 520, the humidified gas is directed towards a lower base surface 49 of a clamp 50. One or more fluid conduits, such as fluid conduit 150 as depicted in FIG. 4, and/or fluid conduit 160 as depicted in FIG. 4 may direct the humidified gas to the lower base surface 49 of the clamp 50. A pump, for example pump 330 as described with respect to FIG. 5, may be configured to pressurize the humidified gas. A pressure of the humidified gas may be increased or decreased to between 80% or 90% or 100% of a vapor pressure of the liquid at a temperature of the lower base surface of the clamp depending on the surface condition, and a pressure sufficient to move or lift the clamp with respect to a clamp assembly. As described above with respect to FIG. 6b, the pressure may result in condensation of the liquid on the lower base surface of the clamp.

In a third step 530, the pressure of the gas is maintained for a duration of time. That is, the pressure of the gas is maintained, e.g. held, at a pressure between a vapor pressure of the liquid at a temperature of the lower base surface of the clamp, and a pressure sufficient to lift the clamp with respect to a clamp assembly. For example, the pressure may be maintained for 1, 5, 10, 60 minutes, or longer, to ensure sufficient discharge of the clamp.

In a further step 540, the humidified gas is removed from the lower base surface 49 of the clamp 50. The humidified gas may be directed and/or pumped away from the opening 152 or/and the opening 162. In a further optional step, gas which has not been humidified, e.g. a non-humidified backfill gas, may be directed towards the lower base surface of the clamp to dry up any remaining moisture present on the lower base surface of the clamp. For example, as described above with respect to FIG. 5, in at least one embodiment the gas distribution system may be configured to provide a non-humidified gas by configuring valves such that gas from a gas supply bypasses a reservoir of liquid, thus avoiding exposing the gas to the liquid.

Although specific reference may be made in this text to the use of the clamp assembly in a lithographic apparatus, it should be understood that the clamp assembly and associated method of use described herein may have other applications. For example, such a clamp assembly may find utility in other apparatuses, such as an apparatus for chemical vapor deposition, atomic layer deposition, physical vapor deposition, pulsed laser deposition, molecular beam epitaxy, or the like.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A clamp assembly, the clamp assembly comprising:
   a clamp configurable to clamp a support member to a lower base surface of the clamp by electrostatic adhesion;
   an arrangement configurable to direct a gas to the lower base surface of the clamp;
   wherein the arrangement is configurable to humidify the gas to generate humidified gas by exposing the gas to a liquid.

2. The clamp assembly of claim 1, wherein the arrangement is configurable to remove the humidified gas from the lower base surface of the clamp.

3. The clamp assembly of claim 1, wherein the arrangement is configurable to condense at least a part of the liquid on the lower base surface of the clamp.

4. The clamp assembly of claim 1, wherein the clamp is configurable to clamp an article to an upper base surface of the clamp by electrostatic adhesion.

5. The clamp assembly of claim 1, wherein the arrangement is configurable to maintain a pressure of the gas at or below a threshold, wherein the threshold corresponds to a pressure sufficient to move or lift the clamp with respect to the support member.

6. The clamp assembly of claim 1, wherein the lower base surface of the clamp is provided with an opening configured to direct the humidified gas out of the opening.

7. The clamp assembly of claim 1, wherein the arrangement comprises:
   a pump;
   at least one pressure sensor; and
   a controller communicably coupled to the pump and the pressure sensor.

8. The clamp assembly of claim 1, wherein the arrangement comprises a reservoir for the liquid, and wherein the arrangement is configurable to expose the gas to the liquid by directing the gas through the reservoir.

9. The clamp assembly of claim 1, wherein the lower base surface of the clamp comprises at least one burl, the at least one burl defining at least one channel between the clamp and an upper surface of the support member.

10. The clamp assembly of claim 9, wherein the upper surface of the support member is provided with an opening configured to direct the humidified gas out of the opening.

11. A method of discharging a lower base surface of a clamp, wherein the clamp is configurable to clamp a support member to the lower base surface of the clamp by electrostatic adhesion, and wherein the method comprises the steps of:
    humidifying the gas by exposing the gas to a liquid to generate humidified gas; and
    directing the humidified gas to the lower base surface of the clamp.

12. The method of claim 11, further comprising a step of condensing at least a part of the liquid on the lower base surface of the clamp.

13. The method of claim 12, further comprising a subsequent step of removing the humidified gas and the at least a part of the liquid from the lower base surface of the clamp.

14. The method of claim 12, wherein the step of exposing the gas to a liquid comprises directing the gas through a reservoir of the liquid.

15. The method of claim 11, further comprising a step of pressurizing the gas below a threshold pressure, wherein:
    the threshold pressure is a pressure sufficient to move or lift the clamp with respect to the support member.

* * * * *